United States Patent
Arnzen et al.

(10) Patent No.: US 7,507,944 B1
(45) Date of Patent: Mar. 24, 2009

(54) NON-PLANAR PACKAGING OF IMAGE SENSOR

(75) Inventors: Daniel Arnzen, Eden Prairie, MN (US); Thurman John Rodgers, Woodside, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/477,067

(22) Filed: Jun. 27, 2006

(51) Int. Cl.
H01L 27/00 (2006.01)
H01L 31/00 (2006.01)

(52) U.S. Cl. .................................. 250/208.1; 250/239
(58) Field of Classification Search .............. 250/208.1, 250/239
See application file for complete search history.

(56) References Cited

U.S. PATENT DOCUMENTS

| | | | |
|---|---|---|---|
| 5,510,273 A * | 4/1996 | Quinn | 156/160 |
| 6,169,319 B1 | 1/2001 | Malinovich et al. | |
| 6,429,036 B1 | 8/2002 | Nixon et al. | |
| 6,455,931 B1 * | 9/2002 | Hamilton et al. | 257/723 |
| 6,572,888 B2 * | 6/2004 | Hosier et al. | 156/160 |
| 6,755,069 B1 * | 6/2004 | Pelletier et al. | 72/414 |
| 6,881,943 B1 * | 4/2005 | Yegnashankaran | 250/208.1 |
| 6,943,425 B2 * | 9/2005 | Costello | 257/447 |
| 6,969,839 B2 * | 11/2005 | Costello | 250/214.1 |
| 7,190,039 B2 * | 3/2007 | Boettiger et al. | 257/432 |
| 2004/0149888 A1 * | 8/2004 | Costello | 250/214.1 |
| 2005/0139833 A1 | 6/2005 | Janesick et al. | |
| 2005/0255625 A1 | 11/2005 | Janesick et al. | |
| 2006/0035415 A1 * | 2/2006 | Wood et al. | 438/125 |
| 2006/0038183 A1 * | 2/2006 | Oliver | 257/79 |
| 2006/0068586 A1 | 3/2006 | Pain | |
| 2006/0192230 A1 * | 8/2006 | Wood et al. | 257/234 |
| 2007/0045513 A1 | 3/2007 | Lee et al. | |
| 2007/0052050 A1 * | 3/2007 | Dierickx | 257/432 |
| 2007/0132089 A1 * | 6/2007 | Jiang et al. | 257/700 |
| 2007/0194397 A1 | 8/2007 | Adkisson et al. | |
| 2007/0262354 A1 * | 11/2007 | Hsu et al. | 257/228 |

OTHER PUBLICATIONS

Gerhard Klink et al., "Innovative Packaging Concepts for Ultra Thin Integrated Circuits", 2001 Electronic Components and Technology Conference, 0-7803-7038-4/1, 2001, IEEE, 5 pages.

C. Adler et al., "Assembly of Ultra Thin And Flexible ICs", 0-7803-6460-0/00, 2000 IEEE, pp. 20-23.

Erik Jung et al., "Ultra Thin Chips for Miniaturized Products", 0-7803-7430-4/02, 2002 Electronic Components and Technology Conference, 2002 IEEE, pp. 1110-1113.

Michael Feil et al., "The Challenge of Ultra Thin Chip Assembly", 0-7803-8365-6/04, 2004 Electronic Components and Technology Conference, 2004 IEEE, pp. 35-40.

Erik Jung et al., "Ultra Thin Chips for Miniaturized Products", 0-7803-7220-4/01, 2001, IEEE, pp. 236-240.

Barbara Pahl et al., "Ultrathin Soldered Flip Chip Interconnections on Flexible Substrates", 0-7803-8365-6/04, 2004 Electronic Components and Technology Conference, 2004 IEEE, pp. 1244-1250.

Barbara Pahl et al., "Ultrathin Assemblies on Flexible Substrates", 0-7803-9578-6/05, 2005 Electronics Packaging Technology Conference, 2005 IEEE, pp. 652-657.

(Continued)

*Primary Examiner*—John R Lee

(57) ABSTRACT

A non-planar frame base for an image sensor.

20 Claims, 14 Drawing Sheets

OTHER PUBLICATIONS

SEZ 203 Spin-Processor/Single Wafer Processing System Product Data Sheet, downloaded from http://www.sez.com/SEZ+Internet/HeaderNavigation/Products/SingleWaferTools/SEZ+203/main_203.htm, Apr. 25, 2006.

"Introduction to Electronic Packaging," 2004 Georgia Institute of Technology, downloaded from http://www.prc.gatech.edu/academics/elpkg/ on Mar. 27, 2006.

Gennadiy Agranov et al., "Crosstalk and Micrlens Study in a Color CMOS Image Sensor", IEEE Transactions on Electron Devices, vol. 50, No. 1, Jan. 2003.

EU Project No. IST-2001-35366, Apr. 26, 2005, 4 pages.

Schott 5th Annual SECAP East Asia Seminar Series, Nov. 1-11, 2004, 1 page.

Anteryon—Integrated Lens Stacks & Camera Modules, Data Sheet, http://www.anteryon.com/products/img_integrated.html, downloaded Aug. 31, 2005.

Advanced Packaging, Wafer Thinning: Techniques for Ultra-thin Wafers, http://ap.pennnet.com/Articles/Article_Display.cfm?Section=Articles&Subsection=Display&ARTICLE_ID=169369, 6 pages.

Saint-Gobain Abrasives, "Backgrinding", http://www.electronics.saint-gobain.com/Data/Element/Node/Application/Application_edit.asp?ele_ch_id=A00000000000000001369 downloaded Jun. 5, 2006, 6 pages.

Resist bonding (Shipley 1827): View, http://www.mems-exchange.org/catalog/P2696/ downloaded Jun. 5, 2006, one page.

Resist bond: View, http://www.mems-exchange.org/catalog/P2222/ downloaded Jun. 5, 2006, one page.

Fusion bonding: Page 1 of 1, http://www.mems-exchange.org/catalog/fusion_bonding/ downloaded Jun. 5, 2006.

De-mounting handle wafer: View, http://www.mems-exchange.org/catalog/P2261/ downloaded Jun. 5, 2006, one page.

* cited by examiner

NON-PLANAR PACKAGING OF IMAGE SENSOR

TECHNICAL FIELD

Embodiments of the present invention relate to optical systems and, more particularly, to a non-planar packing of an image sensor.

BACKGROUND

Solid-state image sensors have found widespread applications, most notably in digital camera systems. Generally, solid-state image sensors are composed of a matrix of photosensitive elements in series with switching and amplifying elements. The photosensitive elements may be, for example, photoreceptors, photo-diodes, phototransistors, charge-coupled devices (CCD), or the like. Each photosensitive element receives an image of a portion of a scene being imaged. A photosensitive element along with its accompanying electronics is called a picture element or pixel. The image obtaining photosensitive elements produce an electrical signal indicative of the light intensity of the image. The electrical signal of a photosensitive element is typically a current, which is proportional to the amount of electromagnetic radiation (light) falling onto that photosensitive element. Conventional image sensors are fabricated using complementary metal oxide semiconductor (CMOS) technology.

The image sensors are part of a larger optical system that typically includes single or multiple lenses that are used to form the image on the photosensitive elements. The optical system is packaged using traditional CMOS packaging technology, with the exception of using a clear glass for a top surface in order to enable the reception of light on the pixels of the image sensor. Using such a traditional CMOS packaging technology, the image sensor die is bonded to a planar metal lead frame, or other planar die housing, in a process referred to as "die attach" using an epoxy, as illustrated in FIG. 1A.

Planar packaging induces several problems for image sensors, a primary problem being optical cross talk. Optical cross talk is due to the location of color filters at some distance from the pixel surface because of intervening metal and insulation layers. Optical cross-talk may be expressed in the percent of the signal lost to a neighboring pixel, which may be a left, right, up or down neighboring pixel or even a $2^{nd}$ or $3^{rd}$ neighboring pixel. Depending on the f-number of the lens disposed above the color filter, the portion of the light signal lost to a neighboring pixel can be large and vary significantly.

Optical cross talk degrades color separation in an image sensor because light incident on the color filter associated with a neighboring pixel is collected by a pixel assigned to a different color. More specifically, light entering the image sensor at angles other than orthogonal passes through the color filter and is partially absorbed by a neighboring pixel rather than the pixel directly below the point of entry of light on the filter of the image sensor, as illustrated in FIG. 1B. Pixels in different regions of an image sensor die are shown in FIG. 1B: a central part of a die and edge parts of the die. Each of the regions is illustrated with two exemplary pixels: a "red" pixel and a "blue" pixel. The exemplary designators "red" and "blue" for the pixels are used to denote that the pixel is intended to receive a color (i.e., wavelength of) of light based on its corresponding filter color disposed above it. The problem of optical cross-talk is illustrated on the edge parts of the die by the receipt of blue light on the "red pixel" (on the left side edge part of FIG. 1B) and by the receipt of red light by "blue pixel" (on the right side edge part of FIG. 1B). Whereas the central part of the die may not exhibit optical cross-talk between neighboring pixels as illustrated by the receipt of red light by the "red pixel" and blue light by the "blue pixel."

Optical cross talk results in a reduction of modulation transfer function (MTF) which is a measure of the optical resolution of the image sensor. One solution for mitigating optical cross talk is to keep the distance between the color filter and the substrate, containing the pixels, as small as possible. However, such a solution imposes constraints on the aspect ratio of the pixels, which limits the reduction in overall stack height of the interconnect layers and makes pixel scaling more difficult. Another solution to partially mitigate optical cross talk is to shift the color filters and the micro-lenses residing on top of the color filter (not illustrated in FIG. 1B) towards the center of the pixel array by an amount that is proportional to the distance from the center. However, such a solution may add design and layout complexity to the optical system. The offset of color filters and micro-lenses may also induce complexities in testing of the optical system. In order to accurately test uniformity of parameters such as fixed pattern noise (FPN) which has the effect of non-uniformity in the response of the pixels in the array, dark signal non-uniformity (DSNU), and photo response non-uniformity (PRNU), a probe card must be built to mimic the angles seen by the image sensor when coupled with a lens or multiple lens stack. One approach is to test the image sensor with a lens or lens stack which may be expensive and difficult. Another conventional approach is to mimic the lens with a "pin hole" aperture or pupil in the probe card. However, such a solution drastically lowers the incident light on the image sensor and adds complexity and cost for the probe-cards and light source.

BRIEF DESCRIPTION OF THE DRAWINGS

The present invention is illustrated by way of example, and not by way of limitation, in the figures of the accompanying drawings in which.

DETAILED DESCRIPTION

A non-planar frame base for an image sensor is described. In the following description, numerous specific details are set forth, such as examples of specific components, materials, fabrication technologies etc., in order to provide a thorough understanding of embodiments of the present invention. It will be apparent, however, to one skilled in the art that embodiments of present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention.

Figure 2A:
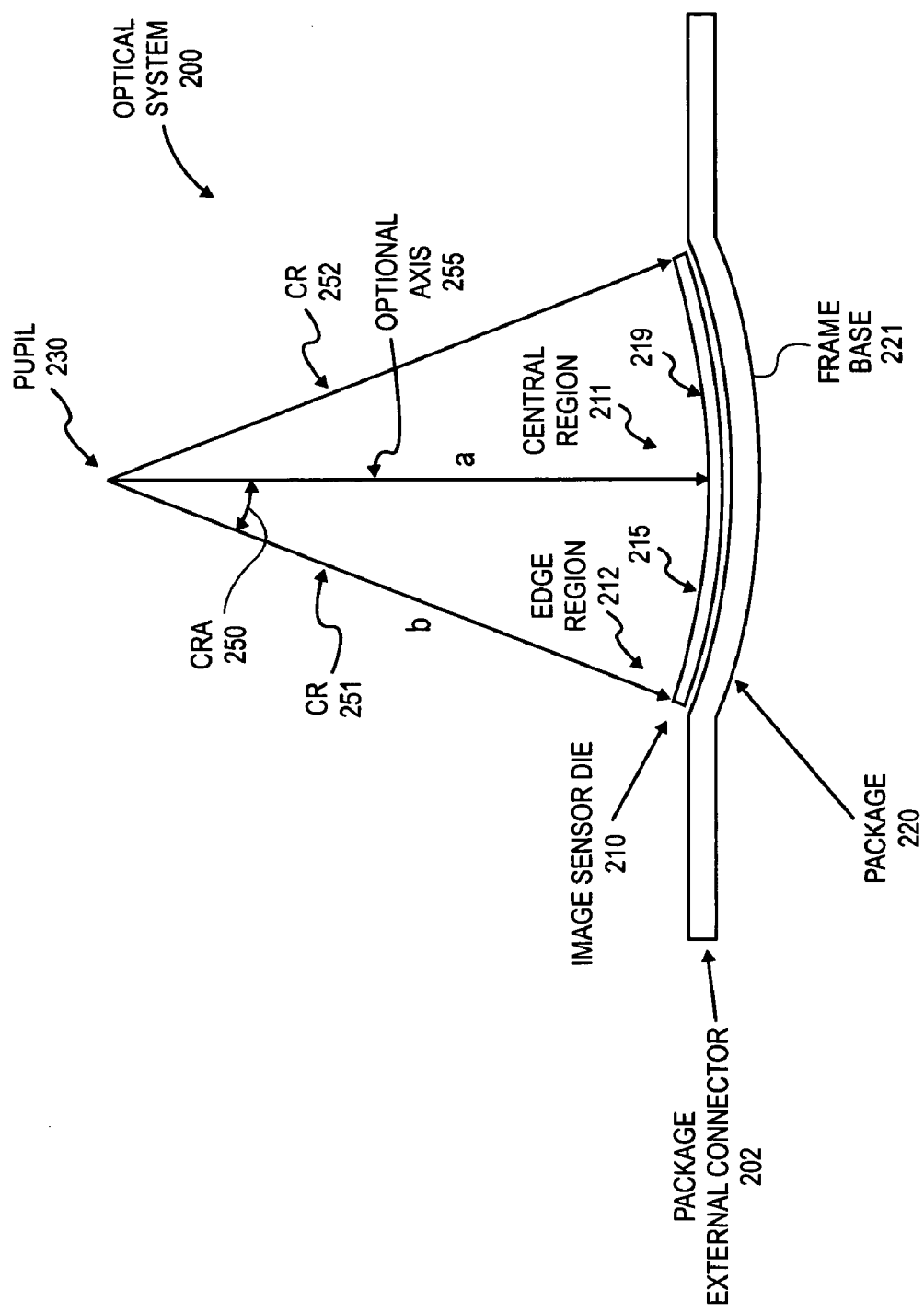
FIG. 2A is a cross sectional view illustrating one embodiment of an optical system having a non-planar frame base and an image sensor.

FIG. 2A illustrates one embodiment of an optical system having a non-planar frame base and an image sensor. Optical system 200 includes an image sensor die 210 and a package 220 having non-planar frame base 221. Optical system 200 also may include an entrance (or exit) pupil 230 from which light enters (or exists) the optical system. For ease of discussion purposes, the pupil 230 is discussed hereafter in regards to an entrance pupil.

In one embodiment, optical system 200 may represent the actual optical system in which the image sensor operates (e.g., a digital imaging system such as a camera). In such an embodiment, the pupil 230 may represent the position in a lens or lens stack (as illustrated in FIG. 2C discussed below) that is disposed above the image sensor die 230 and which is used to form an image on the pixels of the image sensor.

Referring still to FIG. 2A, distances "a" and "b" are the distances from the pupil 230 to the image surface at a central region 211 of the image sensor die 210 and at an edge region 212 of the image sensor die 210, respectively. In one exemplary embodiment, distances "a" and "b" may be approximately 2 mm to 10 mm. The optical system 200 operates with chief rays. A chief ray is a ray (e.g., CR 251 or CR 252), to the edge of the image sensor die 210, which crosses the optical axis 255 at the center of the pupil 230. The chief ray angle (CRA) 250 is the angle between the chief ray (e.g., CR 251) and the optical axis 255 of the system. In one exemplary embodiment, the chief ray angle may be approximately 20 degrees. Alternatively, the chief ray angle may be approximately in a range of 0 degrees (for telecentric optics) to 30 degrees.

In one embodiment of the present invention, the backside substrate of a wafer containing one or more image sensor dies 210, or the backside substrate of individuals image sensor dies 210, are thinned to a point where the die 210 is flexible prior to the die attach process. In one exemplary embodiment, the die substrates may be thinned to have a thickness approximately in a range of 5 to 100 microns. Alternatively, the image sensor die 210 may have another thickness. An exemplary embodiment of a process to thin the backside of a wafer containing one or more image sensor dies 210 is discussed below in relation to FIGS. 4A-4D.

In the die attach process, the thinned and, thereby, flexible, image sensor die 210 is bonded to the non-planar frame base 221. In one embodiment, the non-planar frame base 221 may be fabricated by forming a concave (e.g., spherical) depression 219, relative to pupil 230, in the frame base 221. In one embodiment, the concave depression 210 may be spherical. Alternatively, non-spherical depressions may also be formed, for example, parabolic and cylindrical. The concave depression 219 may be formed using any one of various manufacturing techniques known in the art, for example, stamping, molding, forging, milling, etc. In one exemplary embodiment, the package 220 may be a plastic package having a lead frame. The lead frame may be made using a metal or metal alloy materials, for example, copper (Cu), steel and aluminum, copper alloy. The frame base 221 of the lead frame may be fabricated from a strip of sheet metal by stamping or chemical milling. In one embodiment, the depression may be formed in the frame base 221 during the stamping or chemical milling process. The depression 219 may be sized such that the chief rays, for example, CR 251 and CR 252, are substantially perpendicular to the image sensor surface 215 for substantially all the pixels of the image sensor, for example, at edge regions 212 and 211, respectively, when the image sensor die 210 is bonded into the depression. In one exemplary embodiment, the image sensor surface 215 may have a radius of curvature that is approximately in a range of 2 mm to 10 mm. Alternatively, another radius of curvature may be used. The radius of curvature may be selected to minimize aberration of various types. In one embodiment, the curving of the image sensor surface may be considered as making the image sensor die 210 part of the optics of the system 200.

The bonding of the image sensor die 210 into the depression of frame base 221 flexes the image sensor die 210 to form the curved imaging surface 215. The image sensor die 210 may be bonded into the depression of frame base 221 using, for example, an epoxy.

FIG. 2C is a cross sectional view illustrating one embodiment of an optical system having a lens, a non-planar frame base and an image sensor. In this embodiment, optical system 200 represents an actual optical system in which the image sensor operates (e.g., a digital imaging system such as a camera). In such an embodiment, the optical system 200 may include a lens assembly having a lens 260 disposed within a lens housing 261. The lens 260 includes pupil 230 that represents the position in lens 260 (or, alternatively a lens stack) which is used to form an image 208 of object 209 on the pixels of the image sensor die 210. The embodiment of the optical system 200 illustrated in FIG. 2C also includes an optically transparent layer (e.g., glass) 226 coupled to the package body 227 and disposed above the images sensor die 208. The transparent layer 226 may operate to provide protection of the image sensor die 210.

Figure 2B:
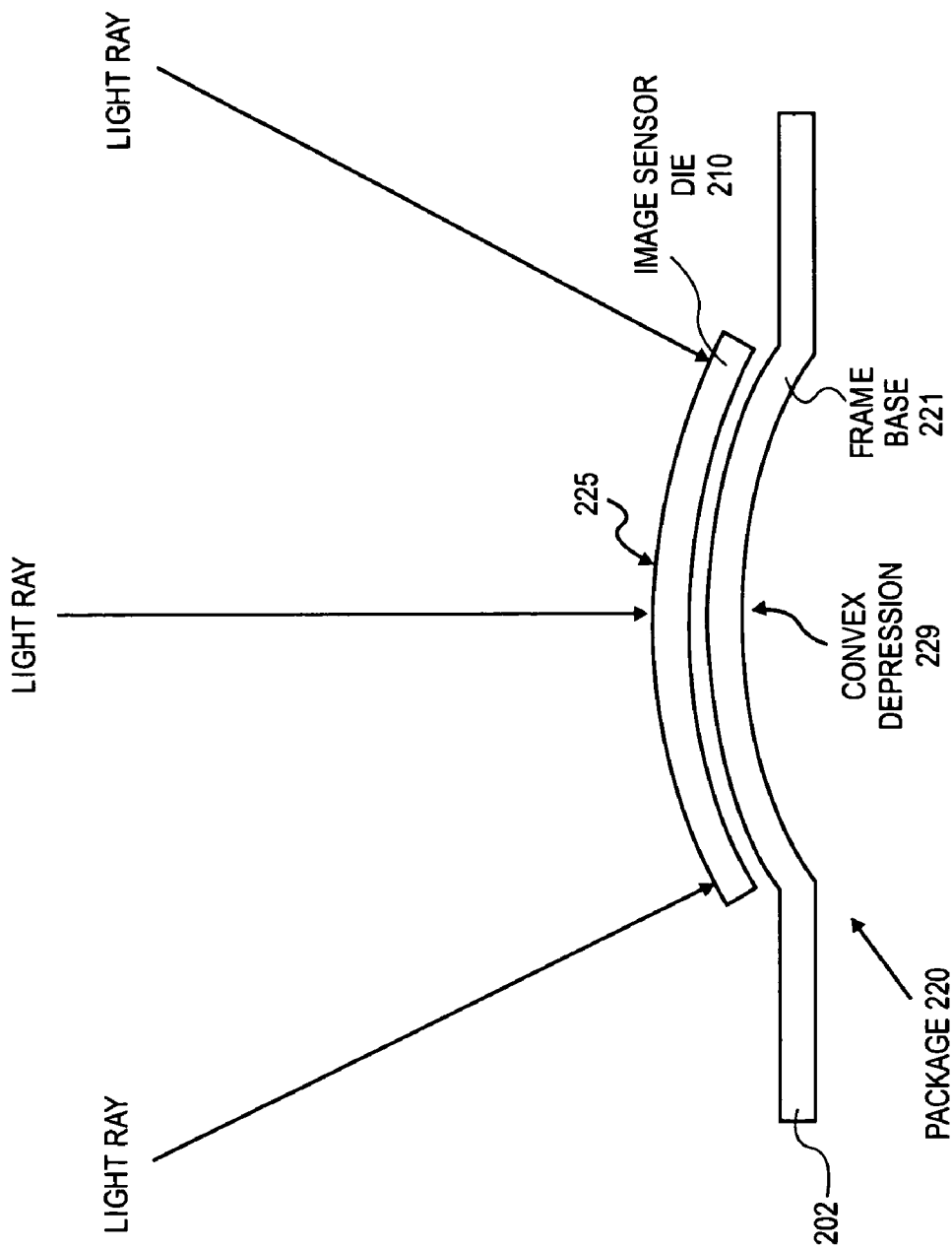
FIG. 2B is a cross sectional view illustrating an alternative embodiment of an optical system having a non-planar frame base and an image sensor.
Figure 2C:
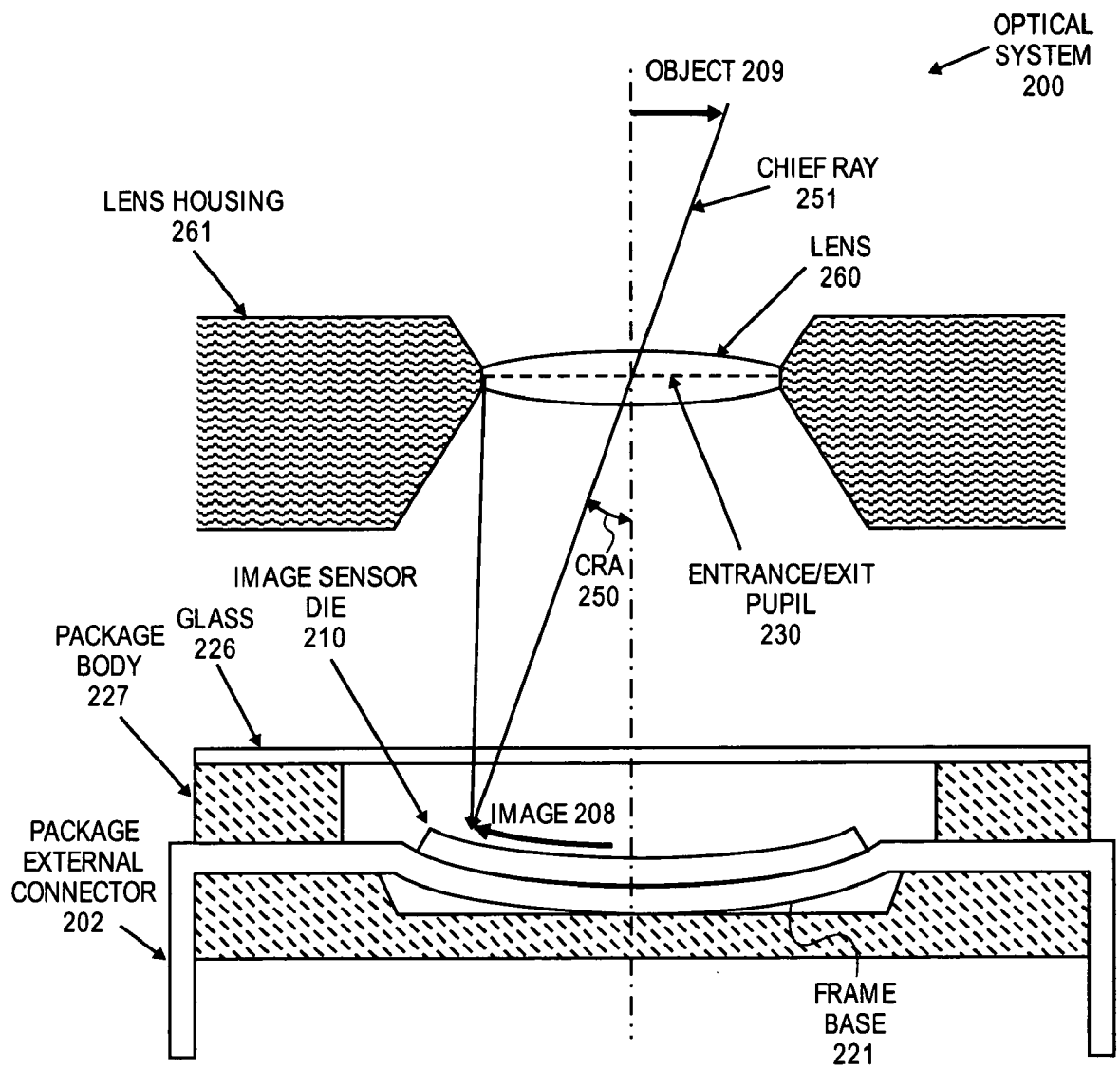
FIG. 2C is a cross sectional view illustrating one embodiment of an optical system having a lens, a non-planar frame base and an image sensor.

FIG. 2B is a cross sectional view illustrating an alternative embodiment of an optical system having a non-planar frame base and an image sensor. In this embodiment, a convex depression 229 is formed in the frame base 221 in contrast to the concave depression 219 illustrated in the frame base 221 of FIG. 2A. In the die attach process, the thinned image sensor die 210 is bonded to the area of the non-planar frame base 221 having convex depression 229, thereby resulting in the image sensor surface 225 having a convex radius of curvature with respect to the pupil 230. Such a convex shaping to the image sensor surface 225 may be used for image sensors with wide field optics. In yet other embodiments, other non-spherical shaping for the depression in the frame base 221 may be used, for example, with planar optics.

Figure 3:
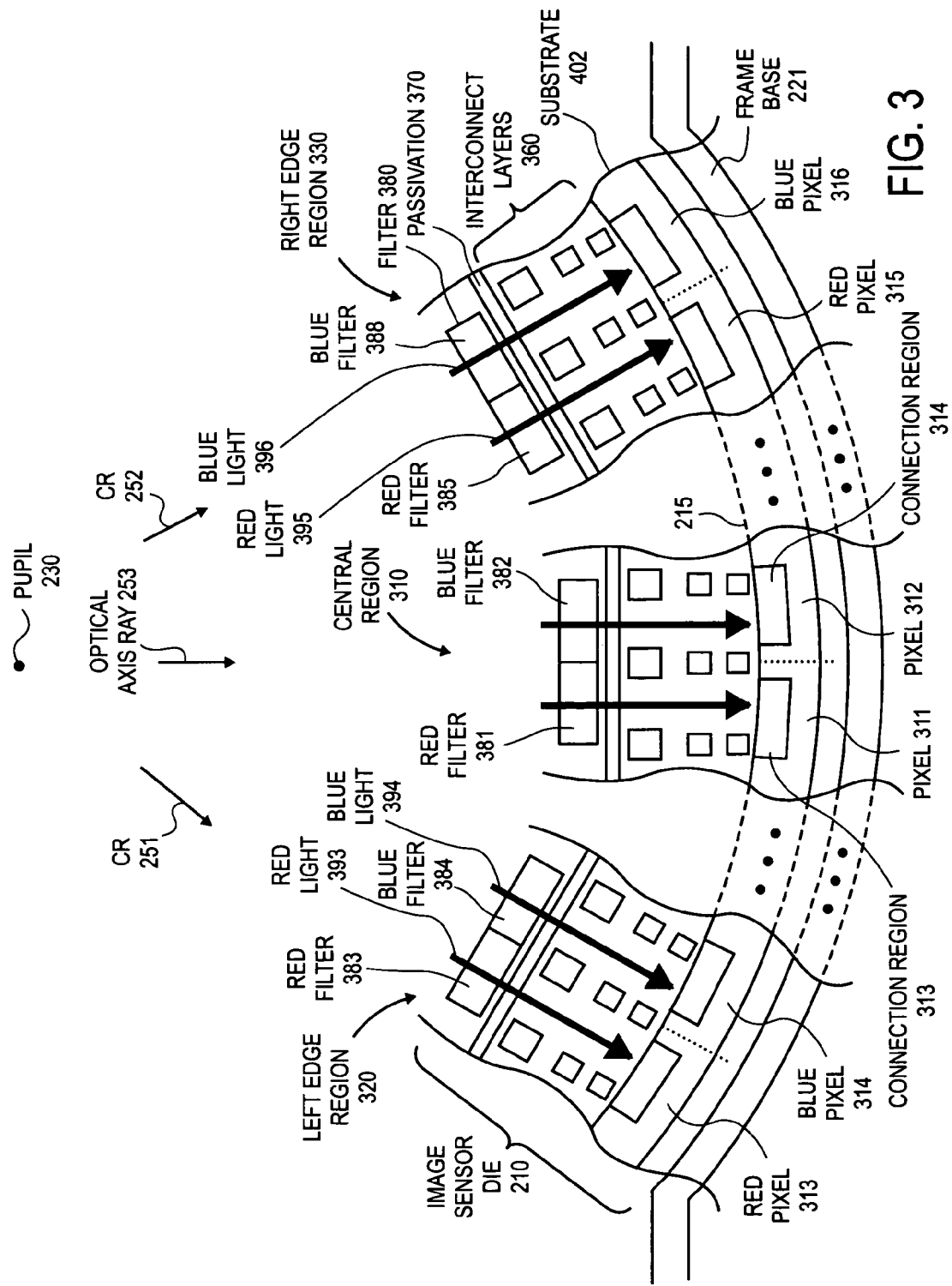
FIG. 3 is a cross sectional view providing a more detailed illustration of the non-planar frame base and image sensor of FIG. 2A.

FIG. 3 is a cross sectional view providing a more detailed illustration of the non-planar frame base and image sensor of FIG. 2A. The image sensor die 210 is shown in its flexed configuration when it is bonded into an exemplary concave depression of frame base 221, thereby forming exemplary curved imaging surface 215. Image sensor die 210 includes a substrate 402 having a plurality of pixels, interconnection layers 360 coupled to the pixels, and a passivation layer 370 couple to the interconnection layers.

The pixels in image sensors that are used for light photography are inherently panchromatic. They respond to a broad band of electromagnetic wavelengths that include the entire visible spectrum as well as portions of the infrared and ultraviolet bands. In addition, the shape of the response curve in the visible spectrum differs from the response of the human eye. Accordingly, in the exemplary embodiment of FIG. 3, the image sensor includes a filter 380 disposed between the light source (e.g., entering pupil 230) and the pixel array in order to produce a color image by the image sensor. Filter 380 is color filter array (CFA) composed of a mosaic of red-green-blue filters, with one filter covering each pixel in the pixel array in a certain pattern. A common pattern for a CFA is a mosaic pattern called a Bayer pattern. The Bayer pattern consists of rows (or columns) of alternating green (G) and red (R) filters, alternating with rows (or columns) of alternating blue (B) and green filters. The Bayer pattern produces groupings of four neighboring pixels made up of two green pixels, a red pixel and a blue pixel, which together may be treated as a "color cell" with red, green and blue color signal components. Red, green and blue are primary colors which can be combined in different proportions to reproduce all common colors. The native signal from each pixel corresponds to a single color channel. In a subsequent operation known as "demosaicing," the color signals from neighboring pixels are interpolated to provide estimates of the missing colors at each pixel. Thus, each pixel is associated with one native color signal and two estimated (attributed) color signals (e.g., in the case of a three color system). Additional processing may be performed by the image sensor circuitry to ensure that the RGB output signals associated with each pixel match the RGB values of the physical object. In general, this color adjustment operation also includes white balancing and color saturation corrections. The operations may be carried out in either the analog domain or the digital domain using matrix processing techniques, and are referred to as "matrixing." Color filters, Bayer patterns, demosaicing and matrixing are known in the art; accordingly, a more detailed discussion is not provided.

Although embodiments of the present embodiment may be described herein in relation to a Bayer pattern or particular color filters for ease of explanation, it should be noted that in alternative embodiments other patterns and filter colors may be used. For example, filter 380 can also be made with complementary color filters (e.g., cyan, magenta and yellow) and can have a variety of configurations including other mosaic patterns and horizontal, vertical or diagonal striped patterns (e.g., alternating rows, columns or diagonals of a single color filter). It should also be noted that image sensor die 210 may not include a color filter 380 and that the apparatus and methods described herein may also be utilized to reduce optical cross-talk in monochrome image sensors.

Referring again to FIG. 3, pixels in different regions of the image sensor die 210 are illustrated: a central part 310 of the die 310, a left edge region 320 of the die, and a right edge region 330 of the die. Each of the regions 310, 320 and 330 is illustrated with two exemplary pixels: a "red" pixel and a "blue" pixel. The exemplary designators "red" and "blue" for the pixels are used to denote that the pixel is intended to receive a color (i.e., wavelength of) of light based its corresponding filter 380 color disposed above it. In this exemplary embodiment, central region 310 is shown with red pixel 311 and blue pixel 312 corresponding to red filter 381 and blue filter 381, respectively.

The pixels are conceptually illustrated with as photodiodes formed by collection regions of one conductivity type (e.g., n type) disposed in a substrate 402 that is of an opposite conductivity type (e.g., p type). The collection regions (e.g., collection regions 313 and 314 corresponding to pixels 311 and 312, respectively) operate to collect charge carriers being generated by radiation in substrate 402. It should be noted that substrate 402 may also represent an epitaxial layer. The radiation may be of any type of radiation, for example, all forms of light including infra-red and ultraviolet as well as the optical spectrum, high energy electromagnetic rays such as x-rays and nuclear particles. The pixels also include additional layers and regions (e.g., that may be part of readout circuitry for operating on signals being generated by the charge carriers collected by the collection regions) that are not illustrated so as not to obscure an understanding of embodiments of the present invention. The fabrication and configuration of a pixel is known in the art; accordingly, a more detailed discussion is not provided.

Figure 1A:
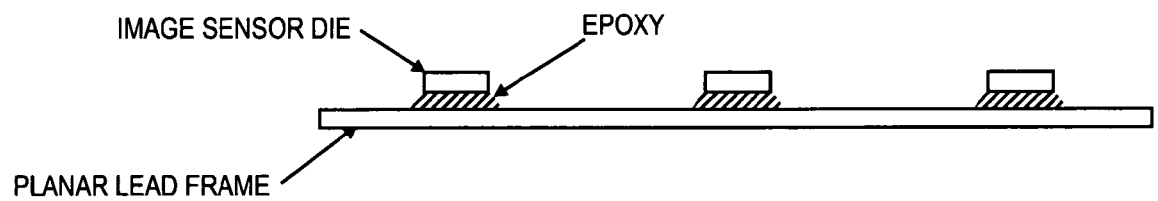
FIG. 1A is a cross sectional illustration representing a conventional packaging of an image sensor die on a planar lead frame after die attach.
Figure 1B:
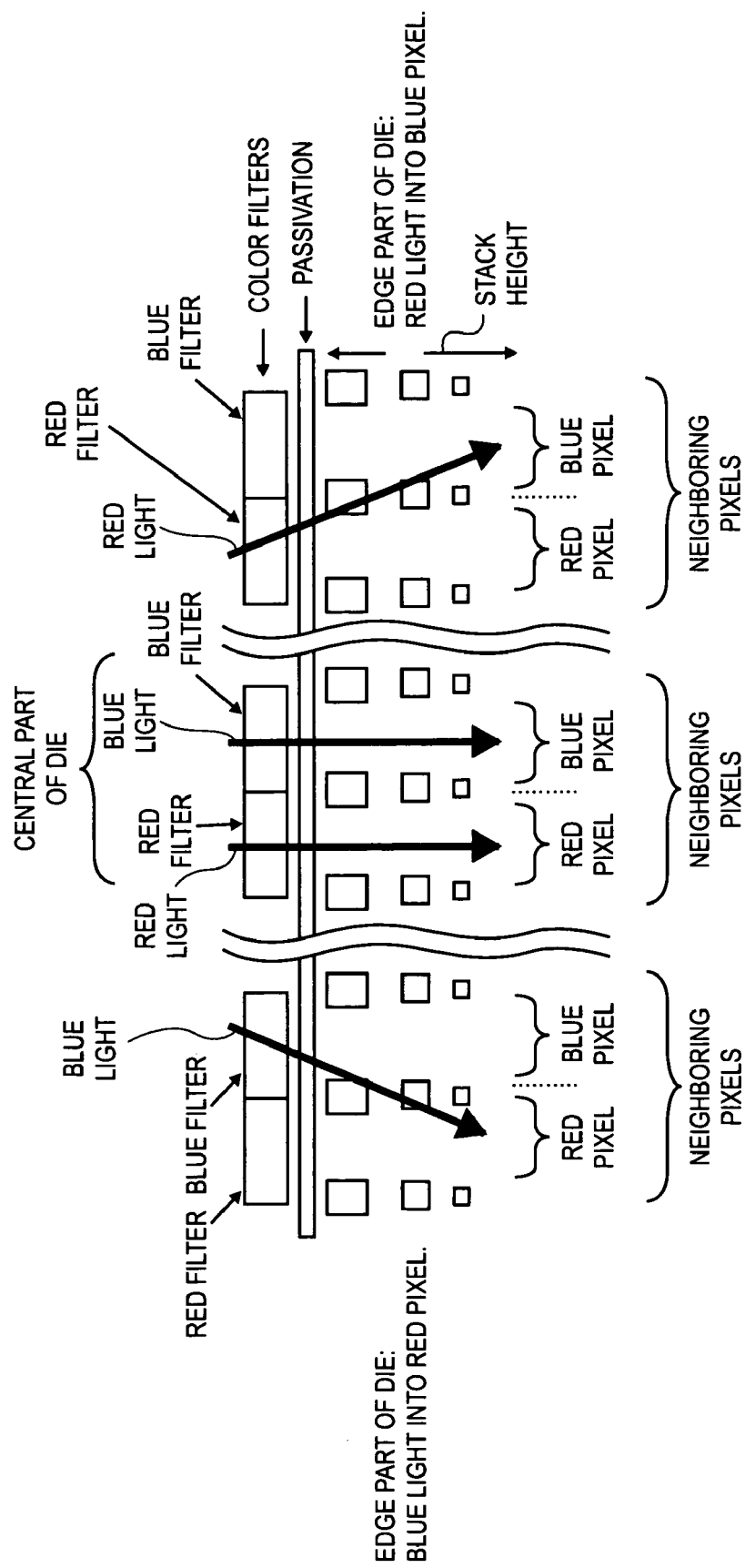
FIG. 1B is a conceptual illustration of optical cross talk in a conventional image sensor.

In this embodiment, the depression is formed in the frame base 221 such that the chief rays, for example, CR 251 and CR 252, are substantially perpendicular to the image sensor surface 215 for substantially all the pixels of the image sensor, for example, at left edge region 320 and right edge region 330, respectively, when the image sensor die 210 is bonded to frame base 221. With such a configuration, the problem of optical cross-talk with an image sensor packaged in a planar lead frame as discussed above in relation to FIG. 1B may be reduced. Whereas blue light is received on the "red pixel" on the left side edge part of FIG. 1B and red light is received by "blue pixel" on the right side edge part of FIG. 1B, in the exemplary embodiment of FIG. 3 of the present invention, such optical cross talk may not be as evident. More specifically, due to the curvature of image sensor die 210 resulting from the flex of the die when bonded in the depression of frame base 221, the blue light 394 that has been filtered by blue filter 384 is received on corresponding blue pixel 314 and the red light 383 that has been filtered by red filter 393 is received on corresponding red pixel 313 with substantially no optical cross talk between the neighboring pixels. Similarly, on the right edge region 330, red light 395 that has been filtered by red filter 385 is received by corresponding red pixel 315 and blue light 396 that has been filtered by blue filter 386 is received by corresponding blue pixel 316 with substantially no optical cross talk between the neighboring pixels. Such a configuration illustrated in FIG. 3 may eliminate the need for complex shifting of the color filters and micro-lenses disposed above the pixels in order to accommodate for the offset angles in received light on the die edges illustrated in FIG. 1B.

An advantage of embodiments of the present invention is that testing may be simplified because diffuse non-collimated light can be used without an entrance pupil in the form of a pin hole aperture on a testing probe card. Another advantage of embodiments of the present invention is that the design of optical elements that are disposed above the image sensor die 210 (not illustrated) may be simplified due to elimination of curvature of field effect. Yet other advantages of embodiments of the present invention include relaxation of constraints on interconnect stack height which may simplify pixel scaling; and elimination of "curvature of field" aberration, which is a result of using a planar imaging surface (that may worsen with short focal length optics).

Figure 4A:
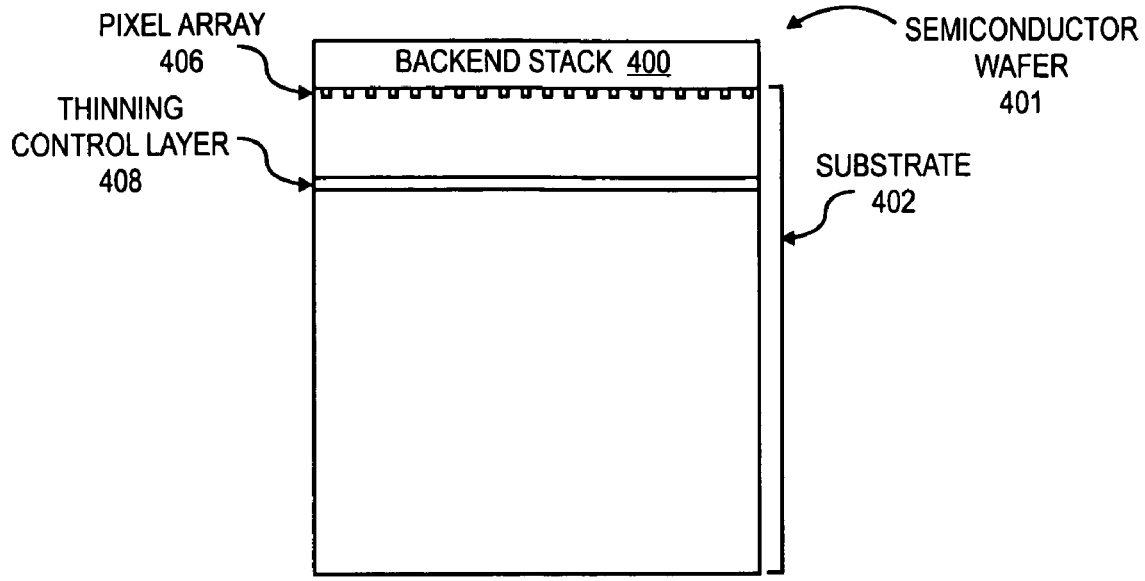
FIGS. 4A-4D illustrate one embodiment of a method for backside thinning a wafer having one or more image sensor dies.

FIGS. 4A-4D illustrate one exemplary embodiment of a method of backside thinning a wafer having one or more image sensor dies 210. In this embodiment, the manufacturing process starts with substrate 402. In one embodiment, substrate 402 is a silicon-on-insulator wafer (SOI). Alternatively, substrate 402 can be a special epitaxial wafer, such as silicon-on-sapphire (SOS), some other type of epitaxial wafer, or a wafer that has a thinning control layer embodied at some depth. Manufacturing techniques for such wafers are known to one of ordinary skill in the art and, accordingly, are not described in detail herein. During the first steps of the manufacturing process, circuit features are fabricated on substrate 402. Following these manufacturing steps, as illustrated in FIG. 4A, semiconductor wafer 401 includes pixel array 406, backend stack 400, and substrate 402. In one embodiment, pixel array 406 includes an array of metal oxide semiconductor technology (MOS-technology) image sensing circuits ("pixels") located under backend stack 400. MOS-technology image sensors are known in the art; accordingly, a more detailed description is not provided. Backend stack 400 includes interconnection layers 360, passivation layer 361 and filter 380 discussed above in regards to FIG. 3.

In one embodiment, semiconductor wafer 401 includes thinning control layer 408 implanted in substrate 402. Thinning control layer 408 provides a chemical stop for the etching process used to remove part of substrate 402 in a later manufacturing step. In one embodiment, thinning control layer 408 is a Separation by IMplantation of OXygen (SIMOX) layer. One method of creating a SIMOX layer is to use an oxygen ion beam implantation process followed by high temperature annealing to create a buried $SiO_2$ layer. Based on the etch selectivity of Si to $SiO_2$ in alkaline aqueous solutions, for example, this $SiO_2$ layer is employed as an etch-stop in preparation of Silicon-on-insulator (SOI) materials. In an alternative embodiment, thinning control layer 408 may be another type of etch stop, such as a carbon-implanted etch-stop. Alternatively, other etch stopping techniques may be based on selective etch speed differences between materials or between different dopant types or dopant concentration levels, or by electro-chemical etch stopping on a junction, or by partial mechanical grinding, polishing or CMP-ing. Such etch stopping techniques are known to one of ordinary skill in the art; accordingly, a detailed discussion is not provided.

Figure 4B:
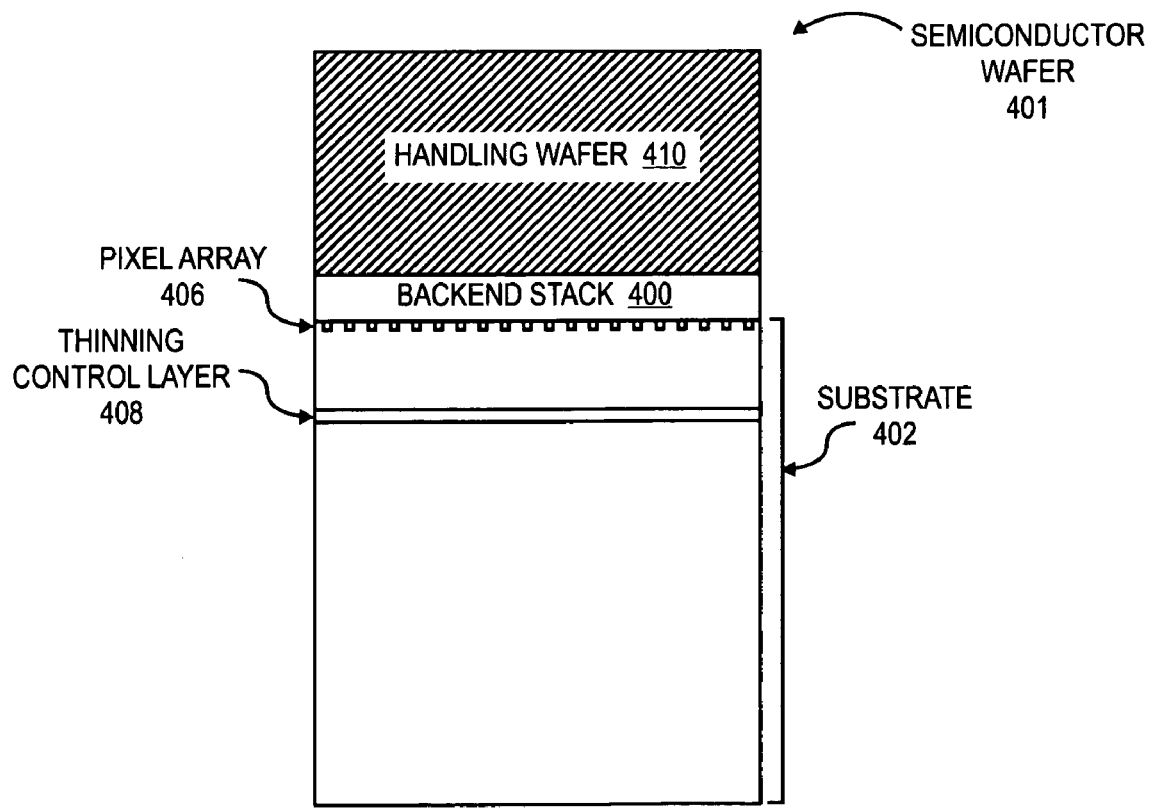

In one embodiment, during the next step in the manufacturing process, as illustrated in FIG. 4B, handle wafer 410 is bonded (in a de-bondable manner) to the semiconductor wafer 401. Handle wafer 410 is used to handle semiconductor wafer 401 and to provide mechanical support for semiconductor wafer 401 during subsequent manufacturing steps. Note that handle wafer 410 obscures backend stack 400, so that direct electrical connections cannot be made to backend stack 400.

Figure 4C:
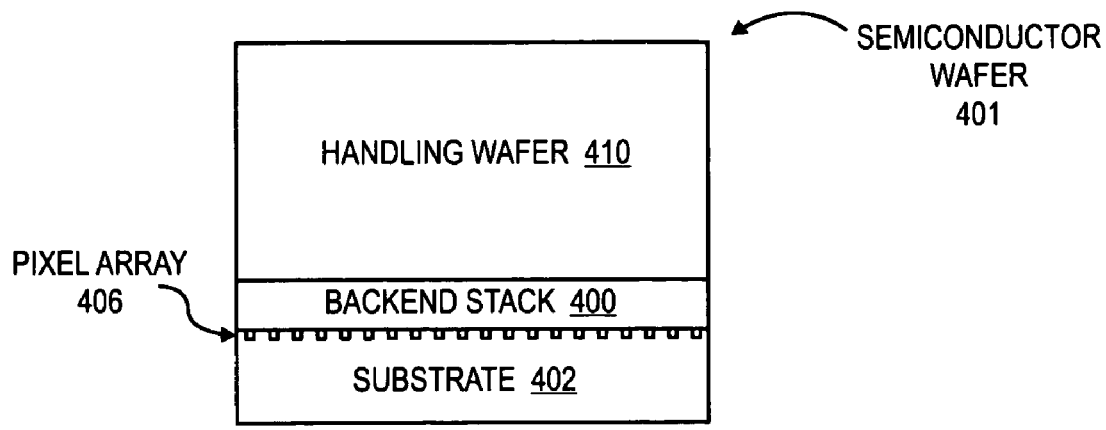

During the next step in the manufacturing process, as illustrated in FIG. 4C, material is removed from substrate 402 of semiconductor wafer 401 to thin the substrate. In one embodiment, the material is removed from substrate 402 by grinding, lapping, or etching. For example, grinding can be used to remove most of the material from substrate 402, while the remainder of the material is removed by etching down to thinning control layer 408. Thinning control layer 408 is then also exposed and etched. Alternatively, etching or grinding can be used to remove material from substrate 402. In another embodiment, techniques such as wafer cleaving the water-jet-into-porous-Si are used to remove the material from substrate 402. It should be noted that in alternative embodiments other wafer thinning techniques may be used as are well known in the art. For example, in an alternative embodiment, a wafer processing system such as the SEZ 203 Spin-Processor manufactured by SEZ Holding Ltd. of Zurich, Switzerland may be used to etch the wafer substrate to achieve the desired thinness to the substrate. Other exemplary wafer thinning methods are discussed in more detail below in relation to FIGS. 5A-5B, 6A-6D, and 7A-7D.

Following the removal of the material from substrate 402, substrate 402 is flexible enough to bond to a non-planer frame base 221 in a die attach process as discussed above in relation to FIGS. 2A, 2B and 3.

It should be noted that an image sensor having such a thinned substrate may be affixed in the package in a manner such that the detection of light by pixels in pixel array 406 is through the backside surface of image sensor die. Unlike the front side surface, the backside surface has no circuit features to reflect or absorb incident light, so the amount of light that reaches pixel array 406 significantly increases. In addition, the electrons freed by the incident light travel a shorter distance within substrate 402 before encroaching on the collection region of a pixel. Hence, the electrons scattered under a given pixel are more likely to be collected by that pixel. This reduces the amount of optical cross-talk between the pixels in pixel array 406. In one embodiment, in order to facilitate the detection of visible light, substrate 402 is fabricated to be approximately 5-100 micrometers thick. Alternatively, thinner or thicker substrates may be used to detect selected wavelengths of electromagnetic waves. For example, a slightly thicker substrate can be used to detect infrared light.

Figure 4D:
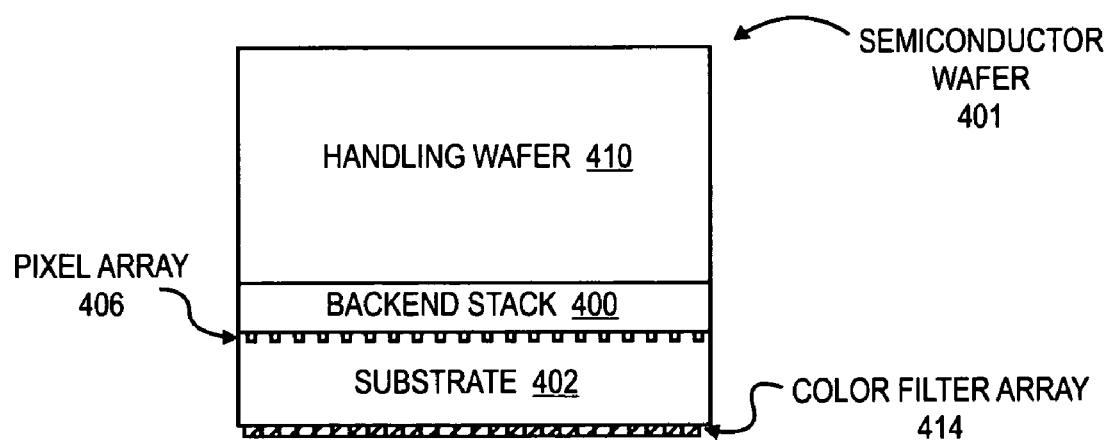

In another embodiment, a color filter array 414 is disposed on the backside of substrate 402, as illustrated in FIG. 4D. Color filter array 414 filters the light by color before the light illuminates the backside of substrate 402. In one embodiment, an anti-reflective layer (not shown) may be disposed on substrate 402.

It should be noted that the color filters and the lens/lens stacks discussed herein may be assembled into the optical system 200 either before or after the wafers thinning operations.

FIGS. 5A-5D illustrate another exemplary embodiment of a method for backside thinning a wafer 401 having one or more image sensor dies 210. In this embodiment, the manufacturing process starts with substrate 402, which may be any type of substrate known in the art such as the substrates described above in regard to FIGS. 4A-4D. As described above, semiconductor wafer 401 includes pixel array 406, backend stack 400, and substrate 402. In contrast to the fabrication of pixel array 406 in FIGS. 4A-4D, pixel array 406 may be fabricated so that backend stack 400 is interposed between pixel array 406 and substrate 402. In another embodiment, semiconductor wafer 401 also includes thinning control layer 408 implanted in substrate 402, as described above.

Figure 5A:
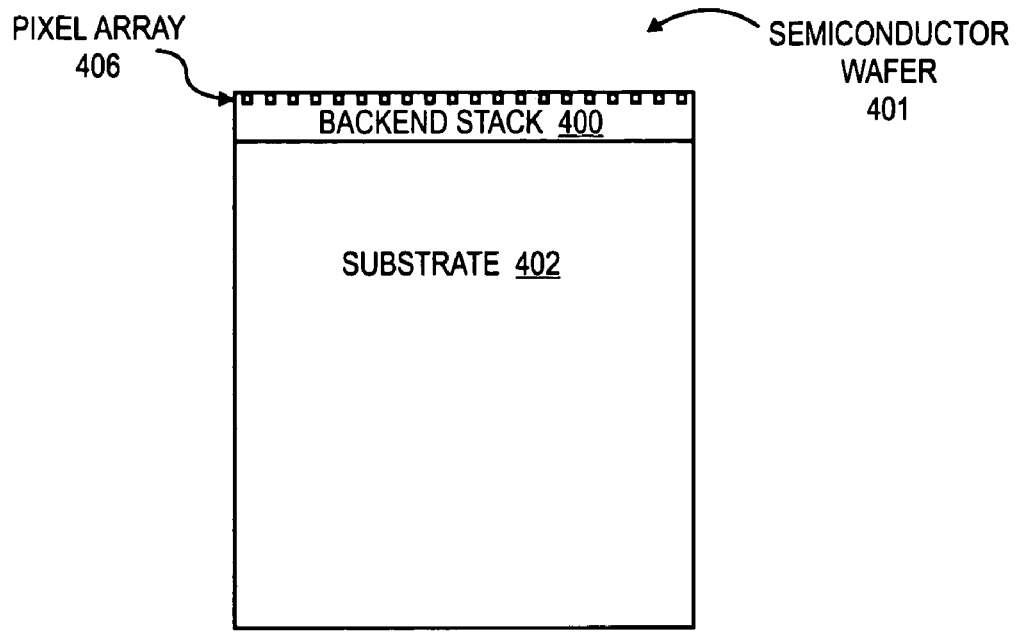
FIGS. 5A-5D illustrate another exemplary embodiment of a method for backside thinning a wafer having one or more image sensor dies.
Figure 5B:
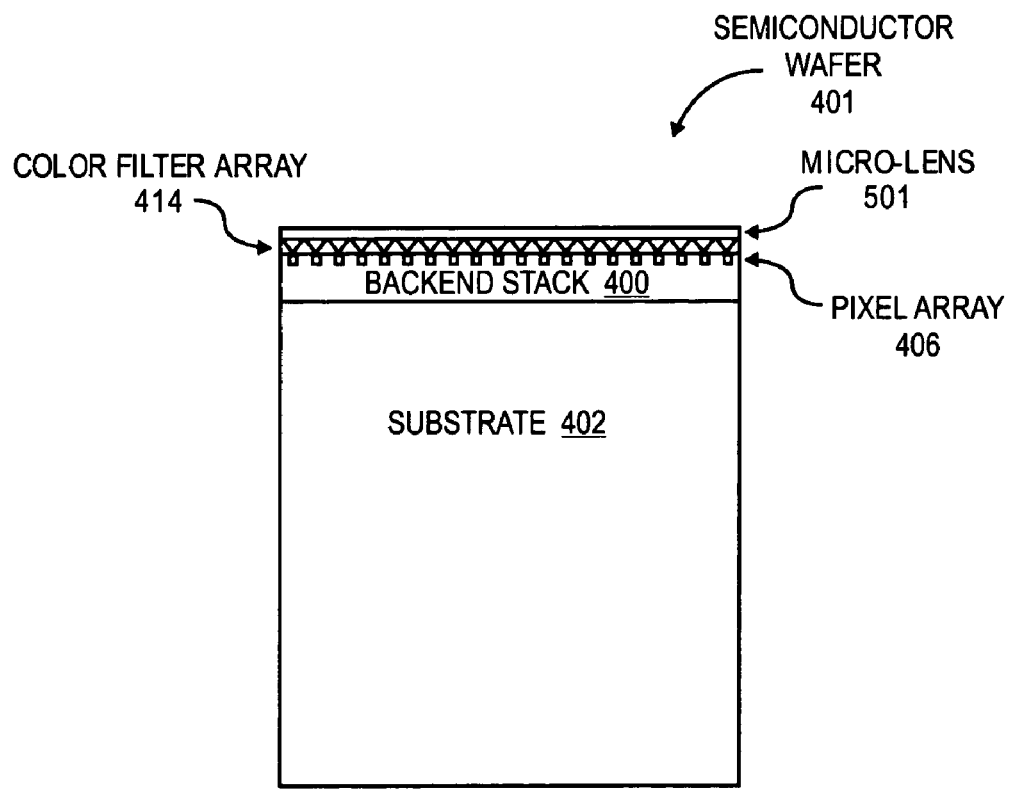

In the illustrated method, mechanical grinding is used to thin the semiconductor wafer 401, although other etch stopping techniques also may be used. In one embodiment, a color filter array 414 is disposed on pixel array 406, as illustrated in FIG. 5B. In one embodiment, one or more micro-lenses 501 may also disposed on color filter array 414 or, alternatively, between color filter array 414 and pixel array 406. In one embodiment, micro-lenses 501 facilitate additional control of the incoming light rays to further direct the light to the corresponding pixels to reduce optical cross-talk. Similarly, micro-lenses 501 may be disposed on other semiconductor wafers 401 in other optical systems such as the systems illustrated in FIGS. 2A, 2B, and 3. Micro-lenses 501 and color filter array 414 may or may not be shifted with respect to pixel array 406. Additionally, an anti-reflective layer (not shown) may be disposed in combination with color filter array 414 and/or micro-lenses 501. In one embodiment, the use of a handle wafer 410 may be unnecessary where color filter array 414 and micro-lenses 501 are disposed on pixel array 406 before substrate 402 is thinned.

Figure 5C:
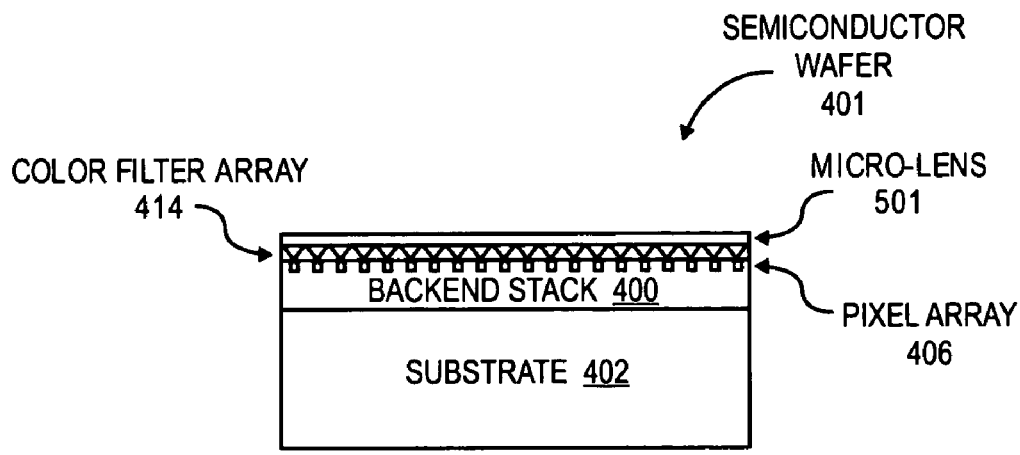
Figure 5D:
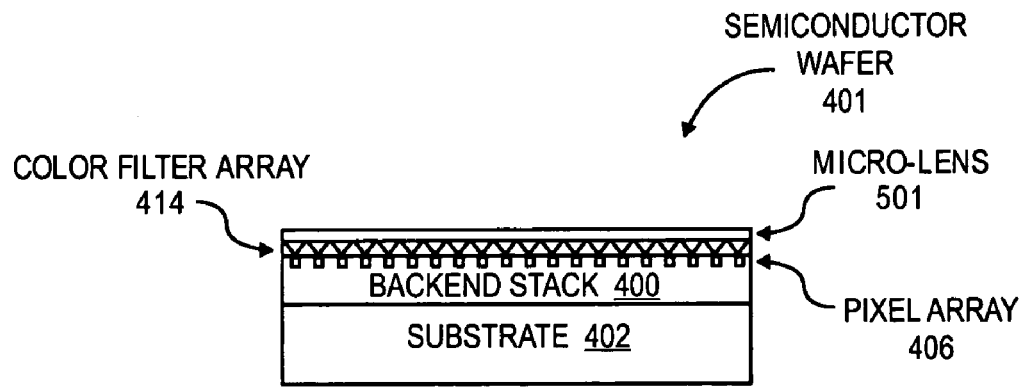

During the next step in the manufacturing process, as illustrated in FIG. 5C, material is removed from substrate 402 of semiconductor wafer 401 to thin the substrate 402. In one embodiment, the material is removed from substrate 402 by coarse grinding. Coarse grinding may be realized by using a coarse grinding wheel to grind most of the material from substrate 402. However, coarse grinding typically results in a relatively rough grinding surface and sub-surface damage to the substrate 402. After coarse grinding, fine grinding may be performed, as illustrated in FIG. 5D, to remove additional material, including the layer of material in which the sub-surface damage is present, from the substrate 402. Subsequent polishing or etching may further refine the ground surface of the substrate 402. Following the removal of the material from substrate 402 using coarse and fine grinding, substrate 402 is flexible enough to bond to a non-planer frame base 221 in a die attach process, as discussed above in relation to FIGS. 2A, 2B and 3.

FIGS. 6A-6E illustrate another exemplary embodiment of a method of backside thinning a wafer 401 having one or more image sensor dies 210. In this embodiment, the manufacturing process starts with substrate 402, which may be any type of substrate known in the art such as the substrates described above in regard to FIGS. 4A-4D. As described above, semiconductor wafer 401 includes pixel array 406, backend stack 400, and substrate 402. In contrast to the fabrication of semiconductor wafer 401 in FIGS. 5A-5D, color filter array 414 and micro-lenses 501 may be disposed on pixel array 406 after substrate 402 is thinned.

Figure 6A:
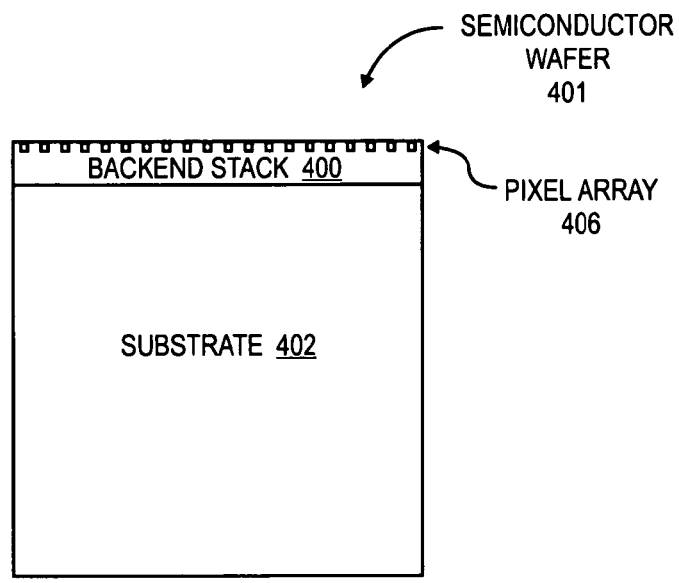
FIGS. 6A-6E illustrate another exemplary embodiment of a method for backside thinning a wafer having one or more image sensor dies.
Figure 6B:
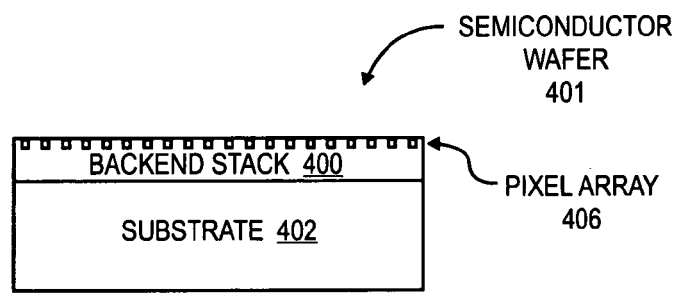
Figure 6C:
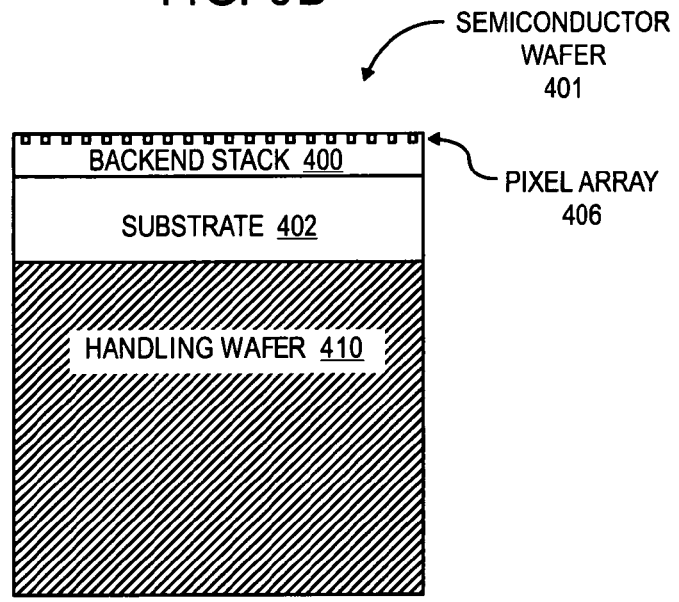

In the illustrated method, mechanical grinding, polishing, and/or etching may be used to thin the semiconductor wafer 401, as shown in FIG. 6B. During the next step in the manufacturing process, as illustrated in FIG. 6C, handle wafer 410 is bonded (in a de-bondable manner) to the semiconductor wafer 401 and, in particular, to the backside of substrate 402 (in contrast to bonding handle wafer to backend stack 400, as shown in FIG. 4B). In certain embodiments, handle wafer 410 may be bonded to substrate 402 using resist bonding, epoxy, fusion bonding, or another known bonding technique. As described above, handle wafer 410 is used to handle semiconductor wafer 401 and to provide mechanical support for semiconductor wafer 401 during subsequent manufacturing steps.

Figure 6D:
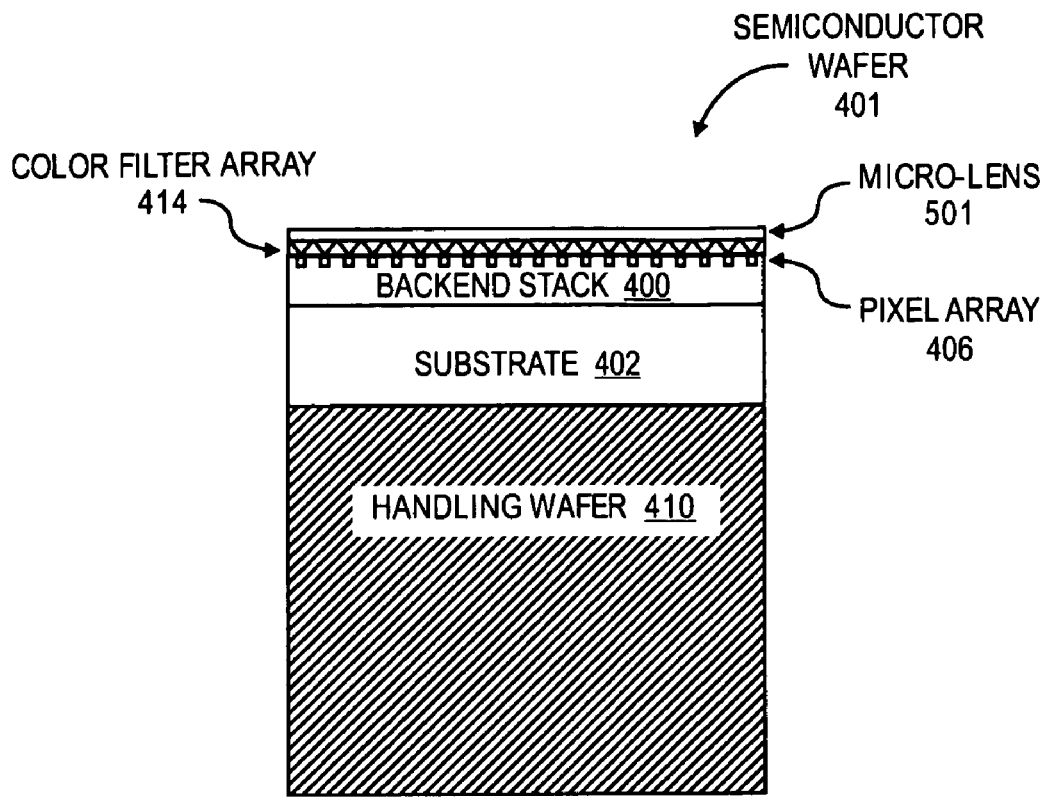
Figure 6E:
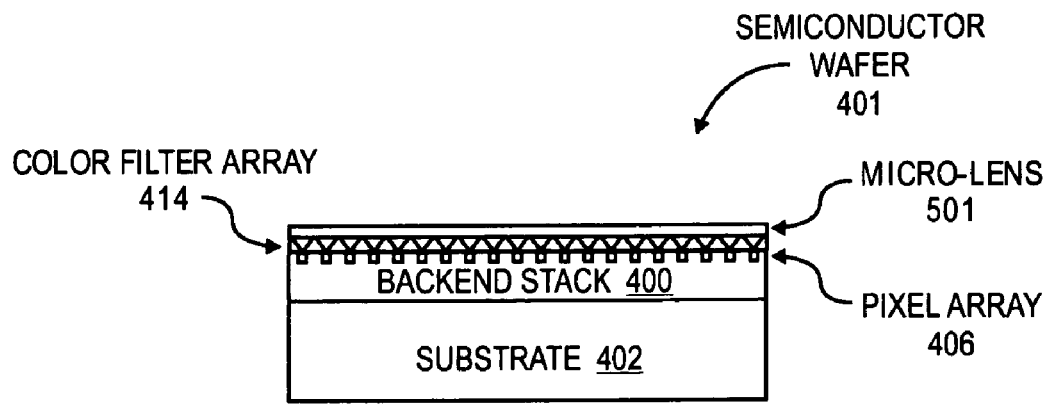

In a subsequent manufacturing step, as illustrated in FIG. 6D, a color filter array 414 and one or more micro-lenses 501 are disposed on pixel array 406. Next, handling wafer 410 is de-bonded and removed from substrate 402, as illustrated in FIG. 6E. Following the removal of handling wafer 410 from the thinned substrate 402, substrate 402 is flexible enough to bond to a non-planer frame base 221 in a die attach process, as discussed above in relation to FIGS. 2A, 2B and 3.

FIGS. 7A-7D illustrate another exemplary embodiment of a method of backside thinning a wafer 401 having one or more image sensor dies 210. In this embodiment, the manufacturing process starts with substrate 402, which may be any type of substrate known in the art such as the substrates described above in regard to FIGS. 4A-4D. As described above, semiconductor wafer 401 includes pixel array 406, backend stack 400, and substrate 402. In contrast to the fabrication of semiconductor wafer 401 in FIGS. 6A-6E, color filter array 414 and micro-lenses 501 may be disposed on pixel array 406 after substrate 402 is partially thinned, without the use of handling wafer 410.

Figure 7A:
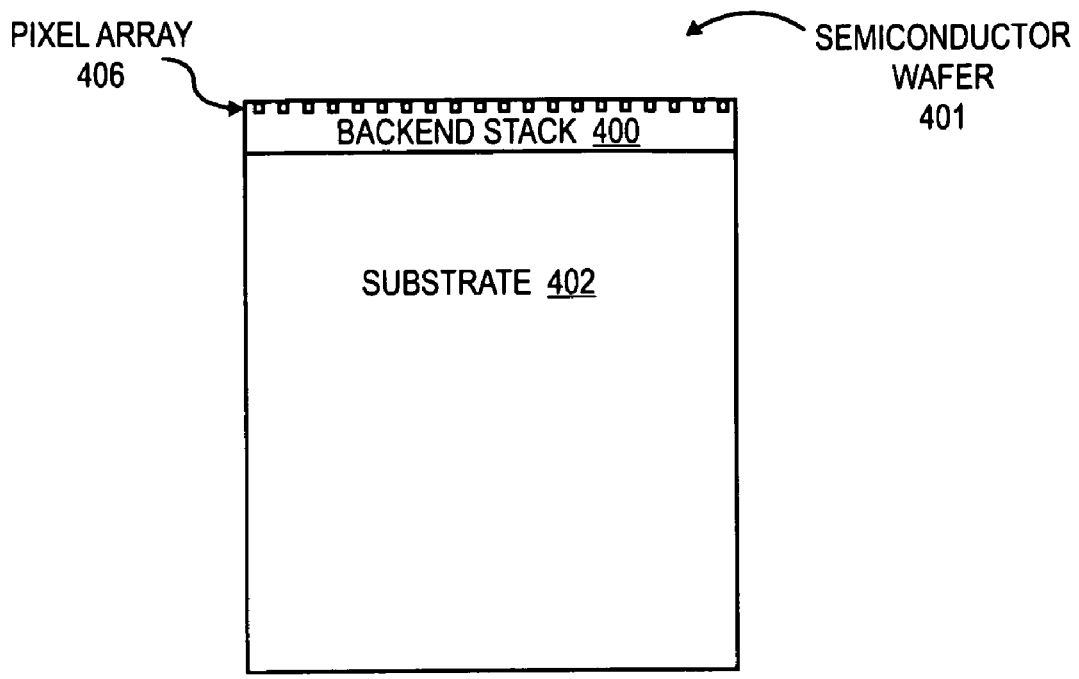
FIGS. 7A-7D illustrate another exemplary embodiment of a method for backside thinning a wafer having one or more image sensor dies.
Figure 7B:
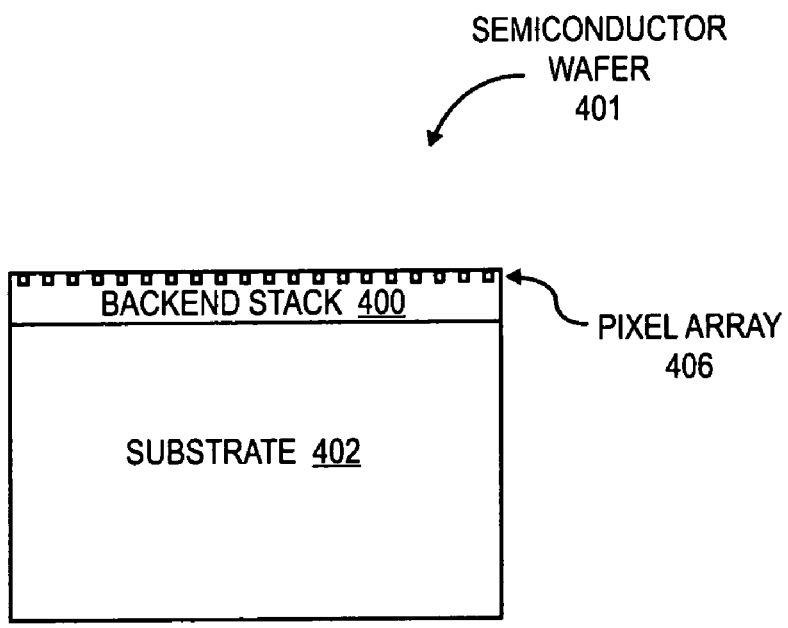
Figure 7C:
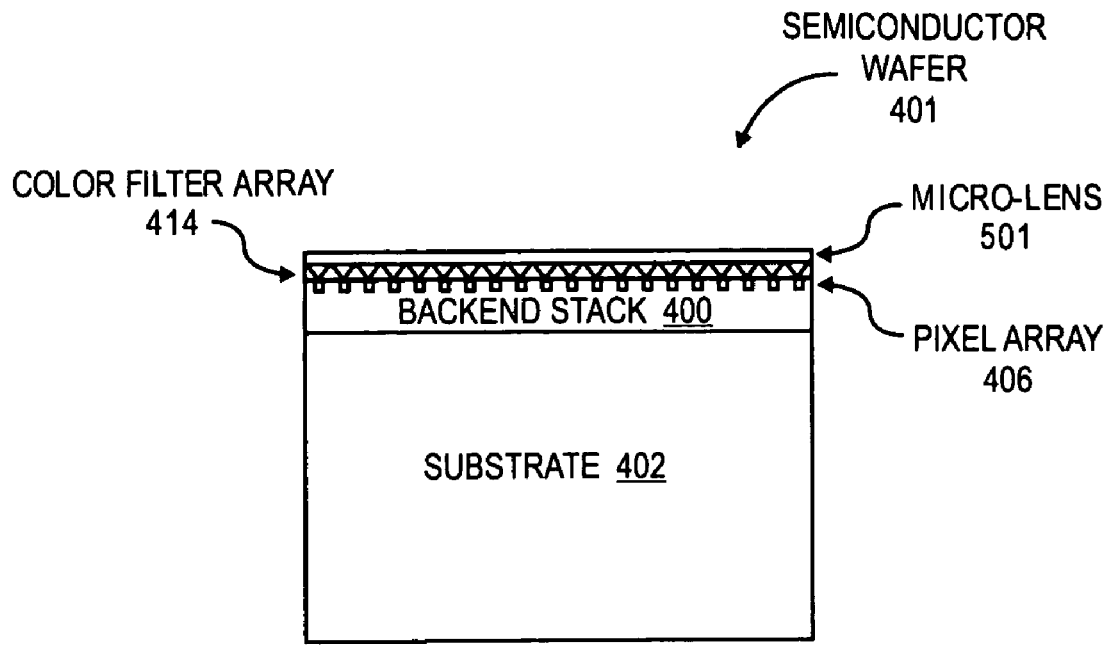
Figure 7D:
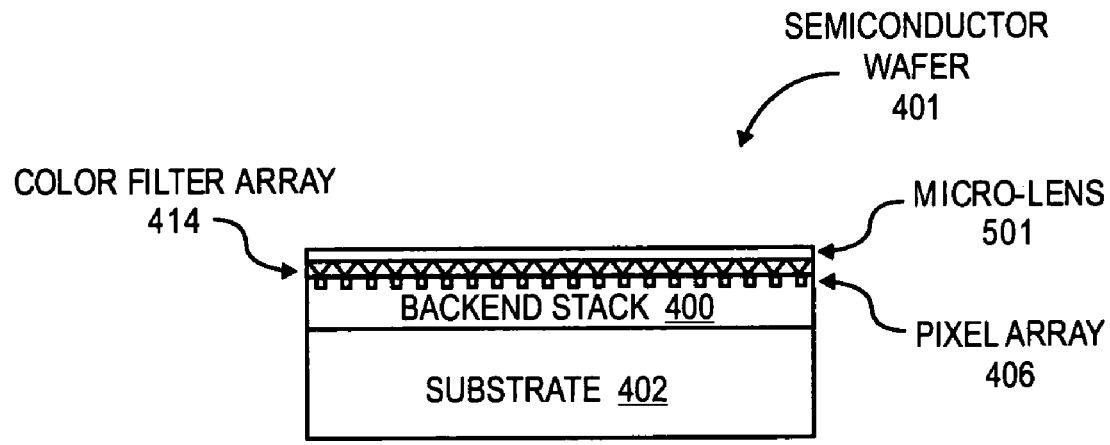

In the illustrated method, mechanical grinding, polishing, and/or etching may be used to partially thin the semiconductor wafer 401, as shown in FIG. 7B. In one embodiment, substrate 402 may be partially thinned to approximately 50% of its original thickness. Alternatively, substrate 402 may be partially thinned to another thickness. In any case, substrate 402 is partially thinned so that the remaining substrate 402 offers sufficient structural support for subsequent steps of the manufacturing process. During the next step in the manufacturing process, as illustrated in FIG. 7C, a color filter array 414 and one or more micro-lenses 501 are disposed on pixel array 406. Substrate 402 is subsequently thinned further, as illustrated in FIG. 7D. In one embodiment, the backside of substrate 402 may be wet etched, as described above, resulting in a fully etched semiconductor wafer 401. In another embodiment, other etching, polishing, and/or grinding techniques may be used to complete the thinning of substrate 402. Following the final thinning of substrate 402, substrate 402 is flexible enough to bond to a non-planer frame base 221 in a die attach process, as discussed above in relation to FIGS. 2A, 2B and 3.

Although discussed at times in relation to a CMOS image sensor with an attached lens stack, the methods and apparatus discussed herein can also be used to form backside thinned image sensor from other technologies using assorted lens arrangements coupled together in various configurations. In addition, although discussed at time in relation to front, or top, side receipt of light, the methods and apparatus discussed herein may also be used with an image sensor that coupled to the frame base and lens in an inverted manner such that it detects light that is illuminating on the backside of the image sensor substrate. In yet other embodiments, the methods and apparatus discussed herein may used to reduce optical cross-talk in monochrome image sensors.

It should be noted that the term "lead frame" as used herein refers to the frame base and external connectors used to provide interconnection between pads of the images sensor die and external components. The external connectors may be, for example, leads, pins, balls, bumps, pads, or "leadless" terminals (i.e., of a "leadless" carrier). It should also be noted that the methods and apparatus described herein may be used with any one of various other package materials (e.g., ceramic) and package types including, for example, in-line, small outline, quad surface mount, grid array, and also multi chip module packages. It should be noted that some packages (e.g., ceramic) do not contain a separate frame but, rather, have a body that also serves as a fram onto which the die is mounted. In such packages, the term refers to the bottom portion of the package body. Furthermore, the image sensor die may be coupled to the external connectors of the package using any one of various bonding technologies, for example, wiring bonding, ball bonding, wedge bonding, tape automated bonding (TAB), controlled collapse chop connection (C4). Such noted packages and bonding technologies are known in the art; accordingly, a more detailed discussion is not provided.

Embodiments of the present have been illustrated and described with a photodiode device type and CMOS technology for ease of discussion. In alternative embodiments, other device types (e.g., photogate and phototransistor), device technologies (e.g., charge coupled device (CCD) and buried channel CMOS), and process technologies (e.g., nMOS, buried channel CMOS and BiCMOS) may be used. Furthermore, the image sensors discussed herein may be applicable for use with all types of electromagnetic (EM) radiation (i.e., wavelength ranges) such as, for example, visible, infrared, ultraviolet, gamma, x-ray, microwave, etc. In one particular embodiment, the image sensors and pixel structures discussed herein are used with EM radiation in approximately the 300-1100 nanometer (nm) wavelength range (i.e., visible light to near infrared spectrum). Alternatively, other the image sensors and pixel structures discussed herein may be used with EM radiation in other wavelength ranges.

It should be noted that the image sensor discussed herein may be used in various applications. In one embodiment, the image sensor discussed herein may be used in a digital camera system, for example, for general-purpose photography (e.g., camera phone, still camera, video camera) or special-purpose photography. Alternatively, the image sensor discussed herein can be used in other types of applications, for example, machine vision, document scanning, microscopy, security, biometrics, etc.

While specific embodiments of the invention have been shown, the invention is not to be limited to these embodiments. The invention is to be understood as not limited by the specific embodiments described herein, but only the scope of the appended claims.

What is claimed is:

1. An apparatus, comprising:
   a non-planar frame base; and
   an image sensor die having a front side coupled to the non-planar frame base, such that light is receivable by the image sensor die through a backside of the image sensor die,
   wherein a thickness of the image sensor die is chosen to detect selected wavelengths of the light.

2. The apparatus of claim 1, wherein the non-planar frame base is curved.

3. The apparatus of claim 1, wherein the non-planar frame base comprises a concave depression.

4. The apparatus of claim 3, further comprise one or more lenses coupled to the image sensor, the one or more lenses having a pupil.

5. The apparatus of claim 4, wherein the image sensor die comprises a plurality of pixels, and wherein the concave depression is configured such that chief rays entering the pupil are substantially perpendicular to the image sensor surface for substantially all of the plurality of pixels.

6. The apparatus of claim 3, wherein the concave depression has a radius of curvature approximately in a range of 2 mm to 10 mm.

7. The apparatus of claim 3, wherein the depression is one of a spherical depression, a cylindrical depression or a parabolic depression.

8. The apparatus of claim 1, wherein the non-planar frame base comprises a convex depression.

9. The apparatus of claim 3, further comprising a lead frame having the frame base.

10. The apparatus of claim 5, wherein the image sensor die is flexed when coupled to the non-planar frame base.

11. A method, comprising:
    forming a depression in a frame base;
    flexing an image sensor die having a plurality of pixels; and
    coupling a front side of an image sensor die to the frame base in the depression, such that light is receivable by the image sensor die through a backside of the image sensor die,
    wherein a thickness of the image sensor die is chosen to detect selected wavelengths of the light.

12. The method of claim 11, further comprising:
    thinning a wafer comprising a plurality of the image sensor dies to a thickness sufficient to flex the plurality of image sensor dies; and
    dicing the wafer to separate the plurality of image sensor dies.

13. The method of claim 12, wherein the flexed image sensor dies induce strain in the semiconductor lattice for the image sensor die.

14. The method of claim 11, wherein forming a depression comprises stamping the frame base.

15. The method of claim 11, wherein forming a depression comprises molding the frame base.

16. The method of claim 11, wherein forming a depression comprises forging or milling the frame base.

17. The method of claim 11, wherein the depression is formed such that chief rays entering a pupil of one or more lenses to be coupled to the image sensor die are substantially perpendicular to the image sensor surface for substantially all of the plurality of pixels.

18. An optical system, comprising:
    an image sensor die having a plurality of pixels disposed in a package to receive light through a backside image sensor surface,
    wherein a thickness of the image sensor die is chosen to detect selected wavelengths of the light;
    one or more lenses having a pupil coupled with the image sensor die; and
    means for receiving chief rays, entering the pupil, substantially perpendicular to the backside image sensor surface for substantially all of the plurality of pixels.

19. The optical system of claim 18, further comprising a color filter disposed between the one or more lenses and the backside image sensor surface.

20. The optical system of claim 18, wherein the means for receiving minimizes optical cross talk among the plurality of pixels.

* * * * *